(12) United States Patent
Chandra et al.

(10) Patent No.: US 8,598,690 B2
(45) Date of Patent: Dec. 3, 2013

(54) SEMICONDUCTOR DEVICE HAVING CONDUCTIVE VIAS IN PERIPHERAL REGION CONNECTING SHIELDING LAYER TO GROUND

(75) Inventors: Harry Chandra, Mountain House, CA (US); Flynn Carson, Redwood City, CA (US)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/360,549

(22) Filed: Jan. 27, 2012

(65) Prior Publication Data

US 2012/0119348 A1  May 17, 2012

Related U.S. Application Data

(62) Division of application No. 12/238,007, filed on Sep. 25, 2008, now Pat. No. 8,110,441.

(51) Int. Cl.
*H01L 23/552* (2006.01)
*H01L 23/02* (2006.01)
*H01L 23/34* (2006.01)
*H05K 9/00* (2006.01)
*H01L 21/00* (2006.01)

(52) U.S. Cl.
USPC .... 257/659; 257/686; 257/723; 257/E23.142; 174/377; 174/388; 174/394; 361/818; 438/110; 438/113

(58) Field of Classification Search
None
See application file for complete search history.

(56) References Cited

U.S. PATENT DOCUMENTS

| | | | |
|---|---|---|---|
| 5,639,989 A * | 6/1997 | Higgins, III | 174/386 |
| 7,045,385 B2 | 5/2006 | Kim et al. | |
| 7,129,422 B2 * | 10/2006 | Arnold | 174/377 |
| 7,187,060 B2 | 3/2007 | Usui | |
| 7,196,415 B2 * | 3/2007 | Zhong et al. | 257/712 |
| 7,342,303 B1 * | 3/2008 | Berry et al. | 257/703 |
| 7,665,201 B2 | 2/2010 | Sjoedin | |
| 7,906,371 B2 | 3/2011 | Kim et al. | |
| 2004/0061213 A1* | 4/2004 | Karnezos | 257/686 |
| 2004/0178500 A1 | 9/2004 | Usui | |
| 2006/0038245 A1* | 2/2006 | Terui | 257/421 |
| 2006/0060953 A1 | 3/2006 | Yang et al. | |
| 2007/0062637 A1 | 3/2007 | Sjoedin | |
| 2008/0019112 A1* | 1/2008 | Hatanaka et al. | 361/814 |
| 2008/0210462 A1 | 9/2008 | Kawagishi et al. | |
| 2009/0294928 A1* | 12/2009 | Kim et al. | 257/659 |
| 2010/0207259 A1 | 8/2010 | Liao et al. | |

* cited by examiner

*Primary Examiner* — Michael Jung
(74) *Attorney, Agent, or Firm* — Robert D. Atkins; Patent Law Group: Atkins & Associates, P.C.

(57) ABSTRACT

A semiconductor device is made by mounting a plurality of semiconductor die to a substrate, depositing an encapsulant over the substrate and semiconductor die, forming a shielding layer over the semiconductor die, creating a channel in a peripheral region around the semiconductor die through the shielding layer, encapsulant and substrate at least to a ground plane within the substrate, depositing a conductive material in the channel, and removing a portion of the conductive material in the channel to create conductive vias in the channel which provide electrical connection between the shielding layer and ground plane. An interconnect structure is formed on the substrate and are electrically connected to the ground plane. Solder bumps are formed on a backside of the substrate opposite the semiconductor die. The shielding layer is connected to a ground point through the conductive via, ground plane, interconnect structure, and solder bumps of the substrate.

19 Claims, 14 Drawing Sheets

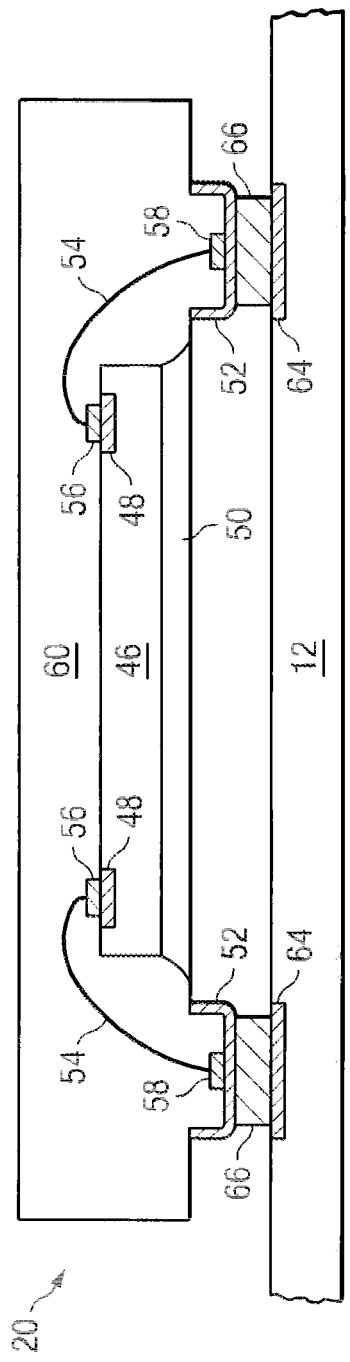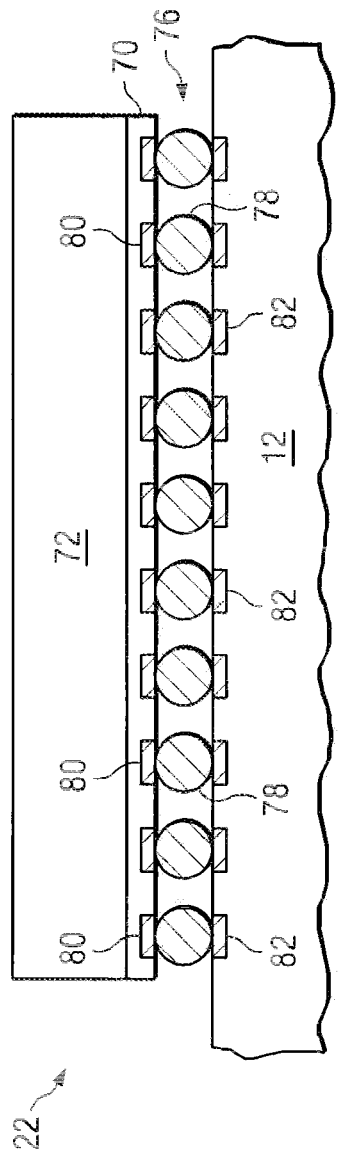

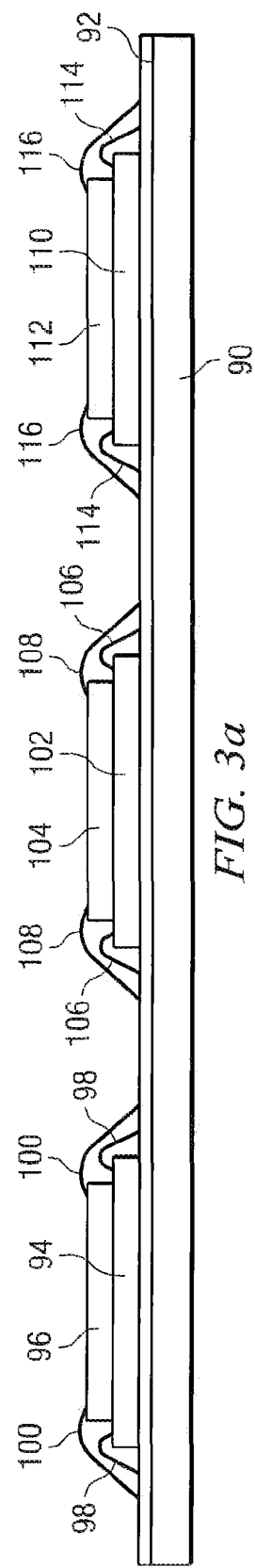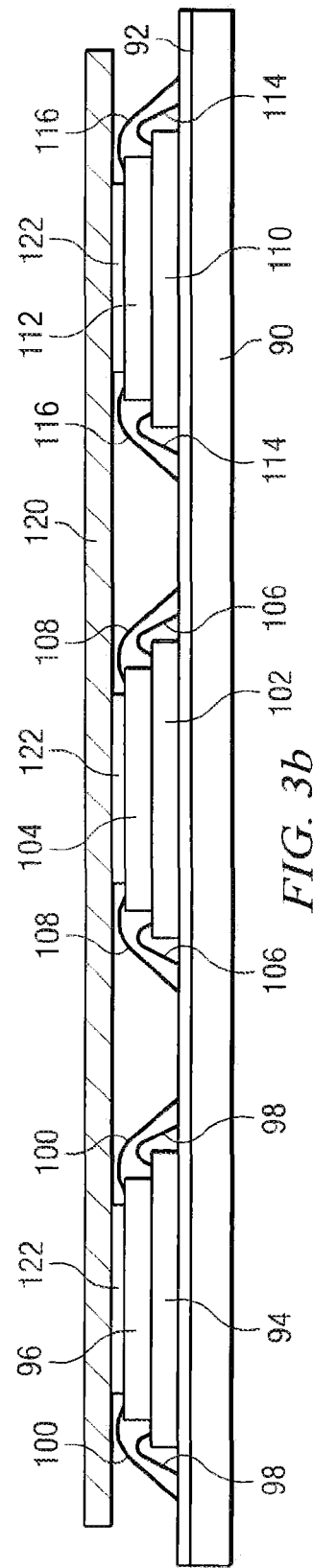

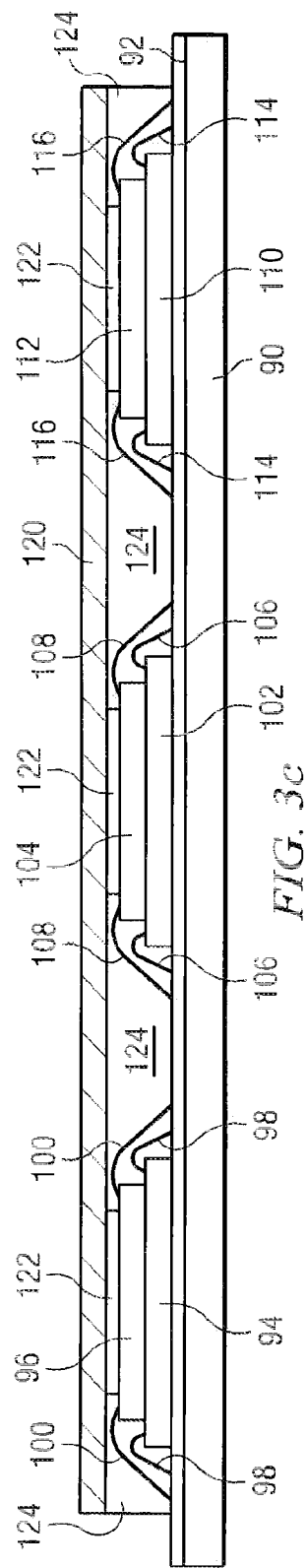
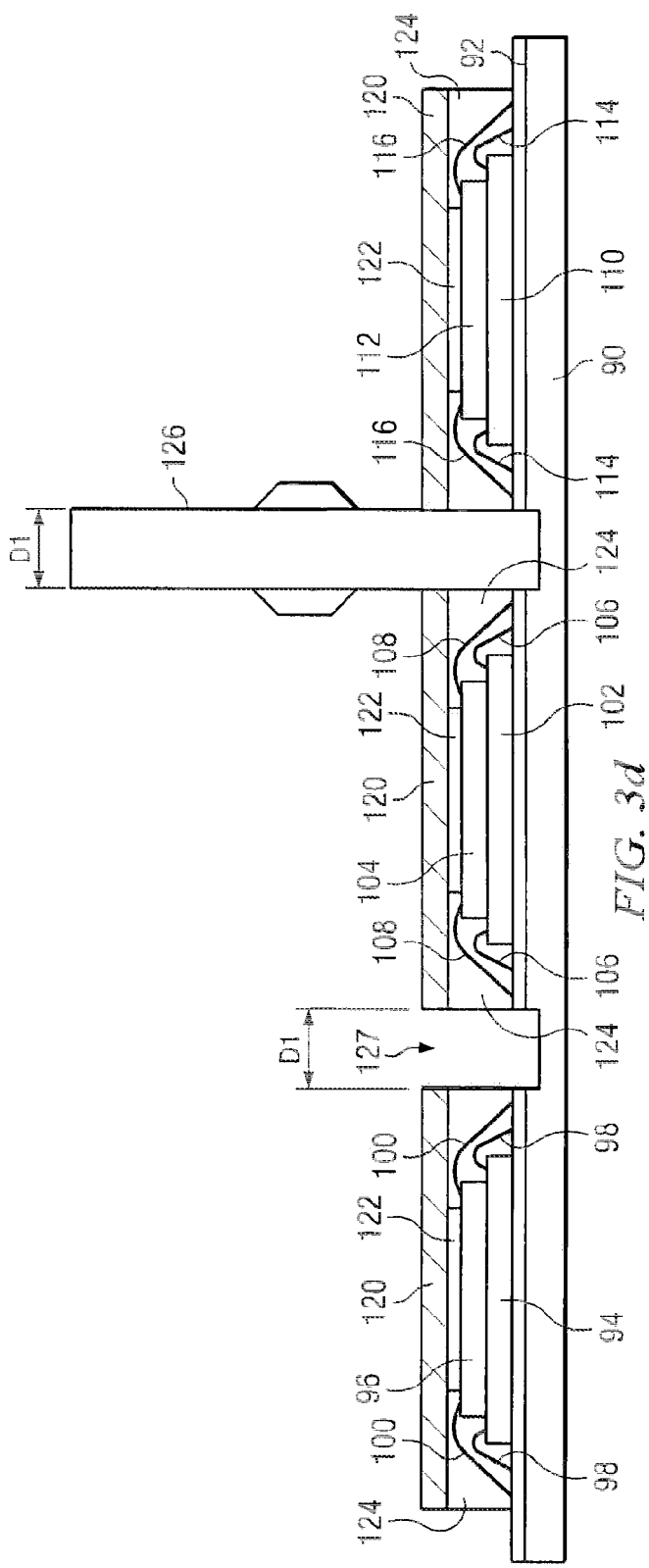

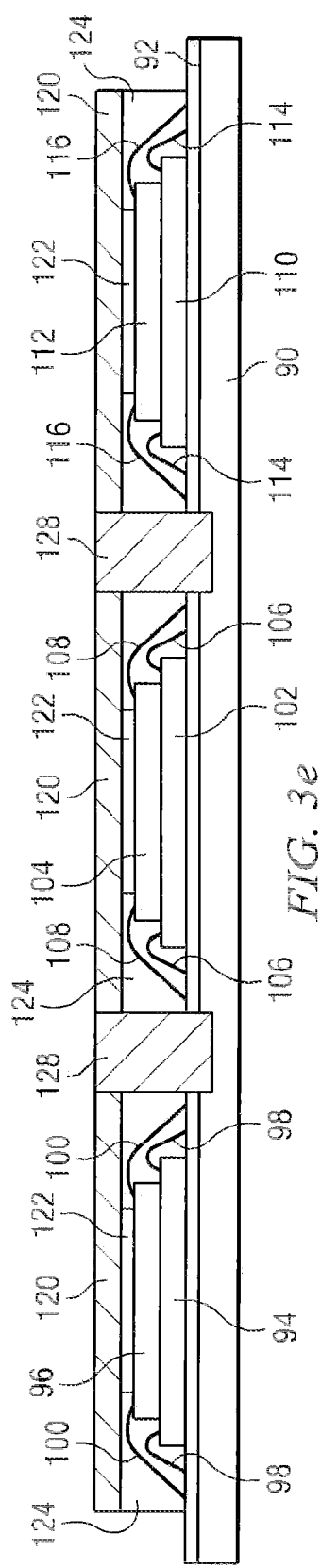
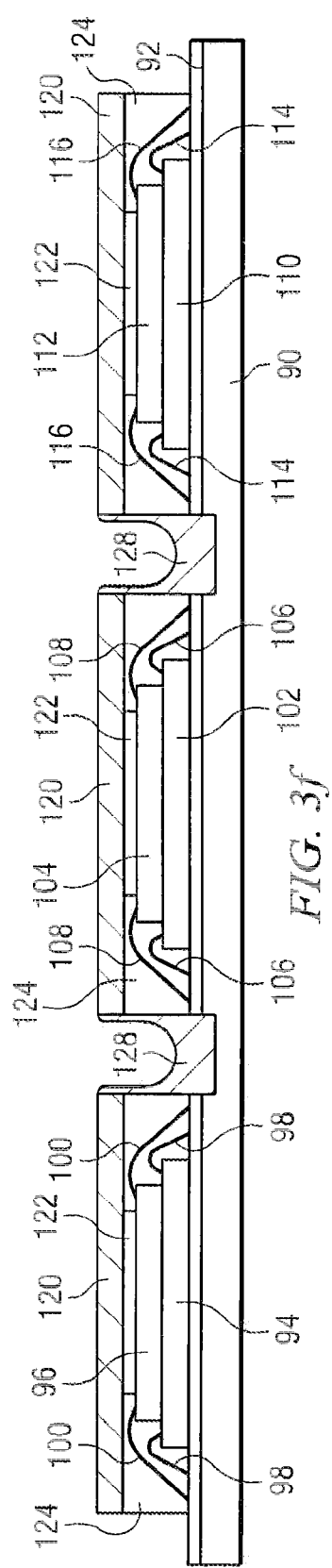

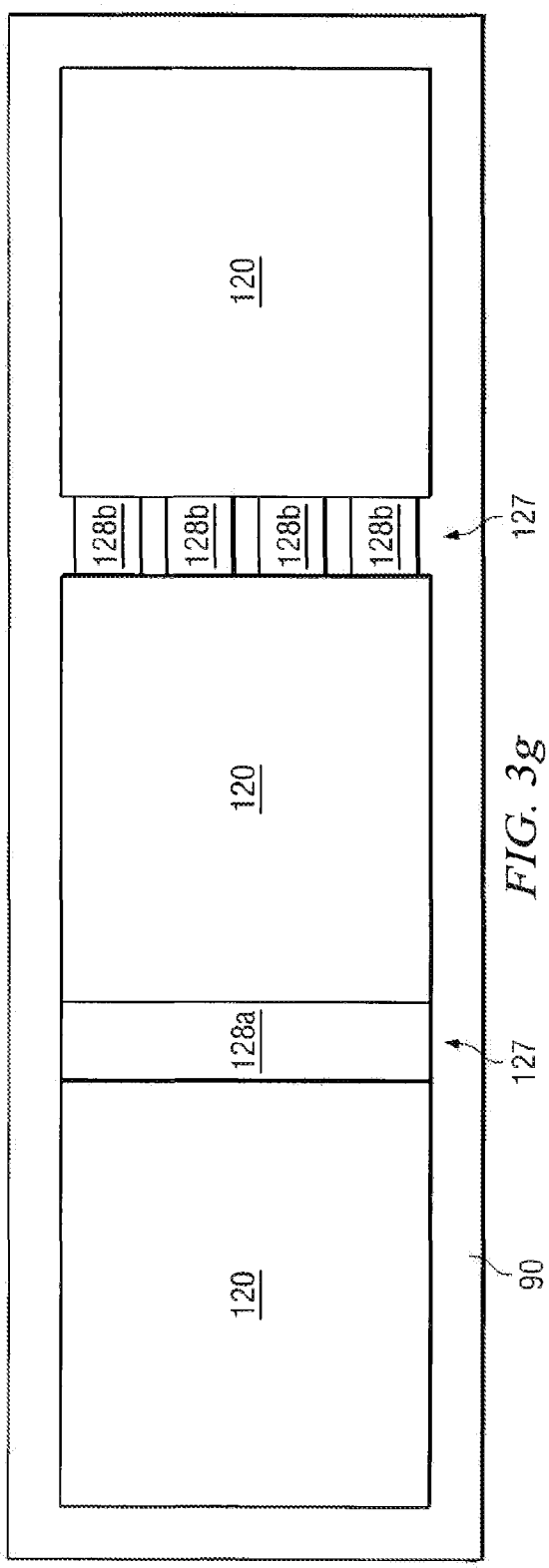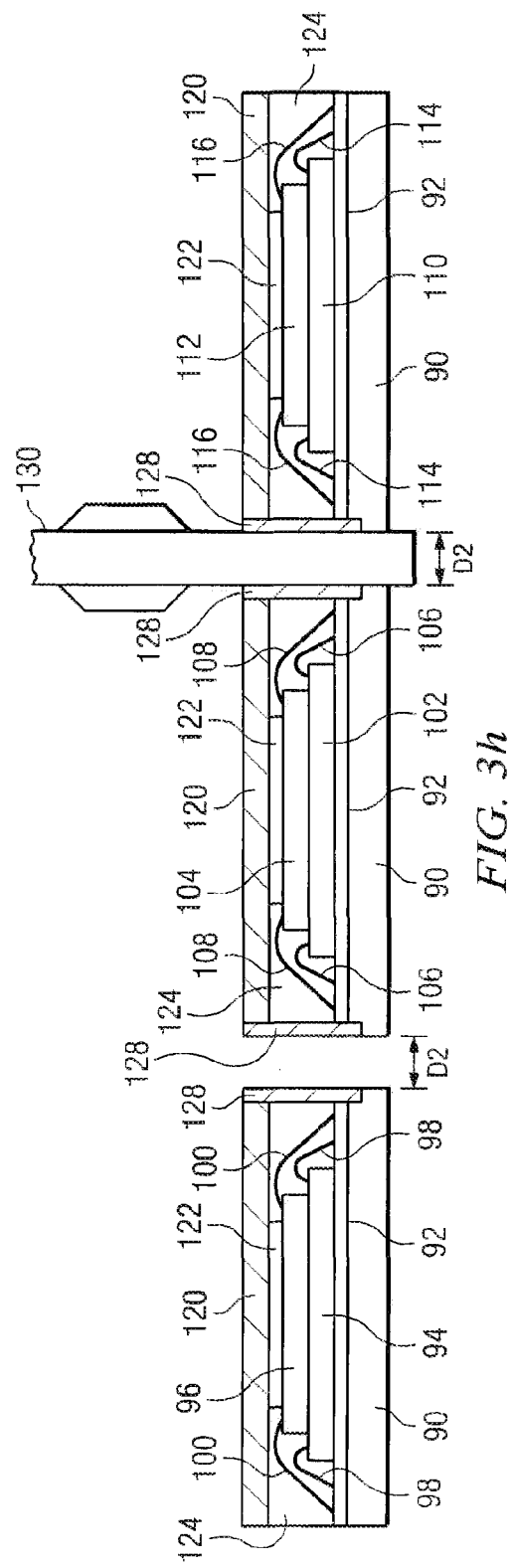

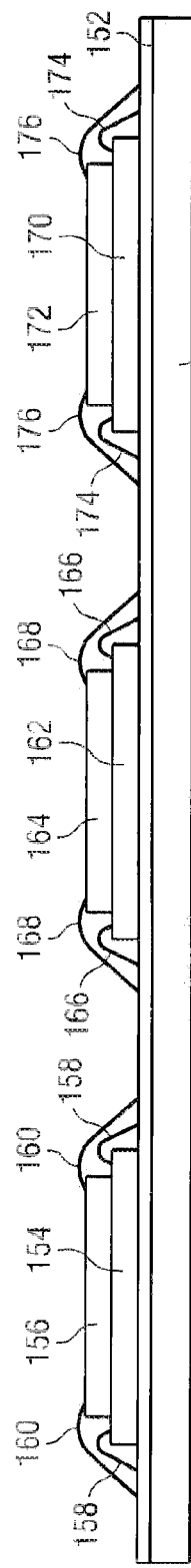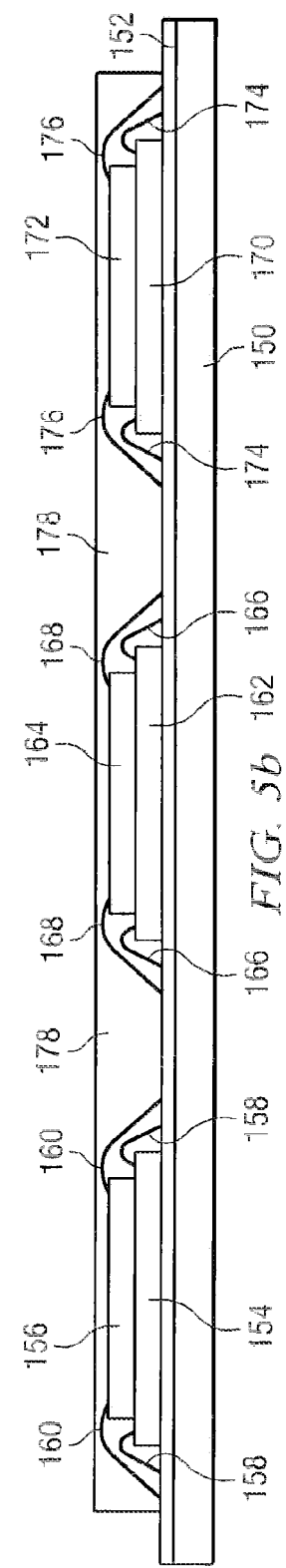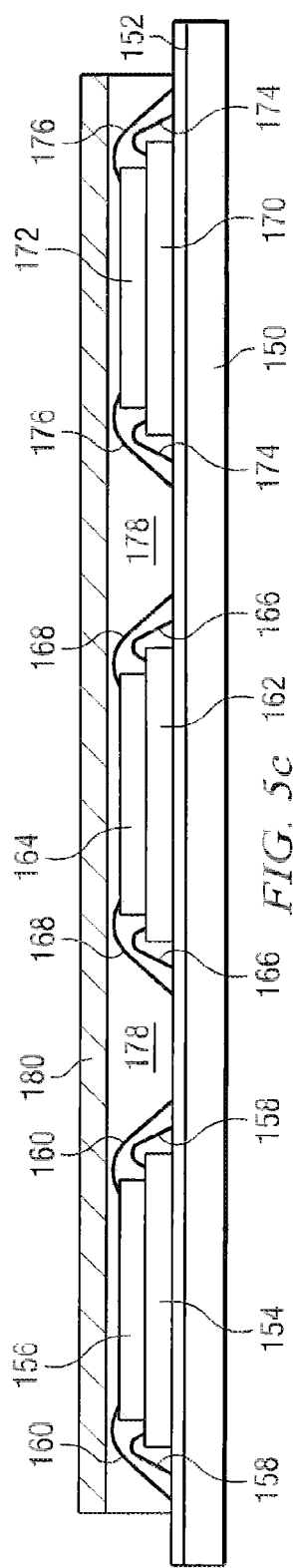

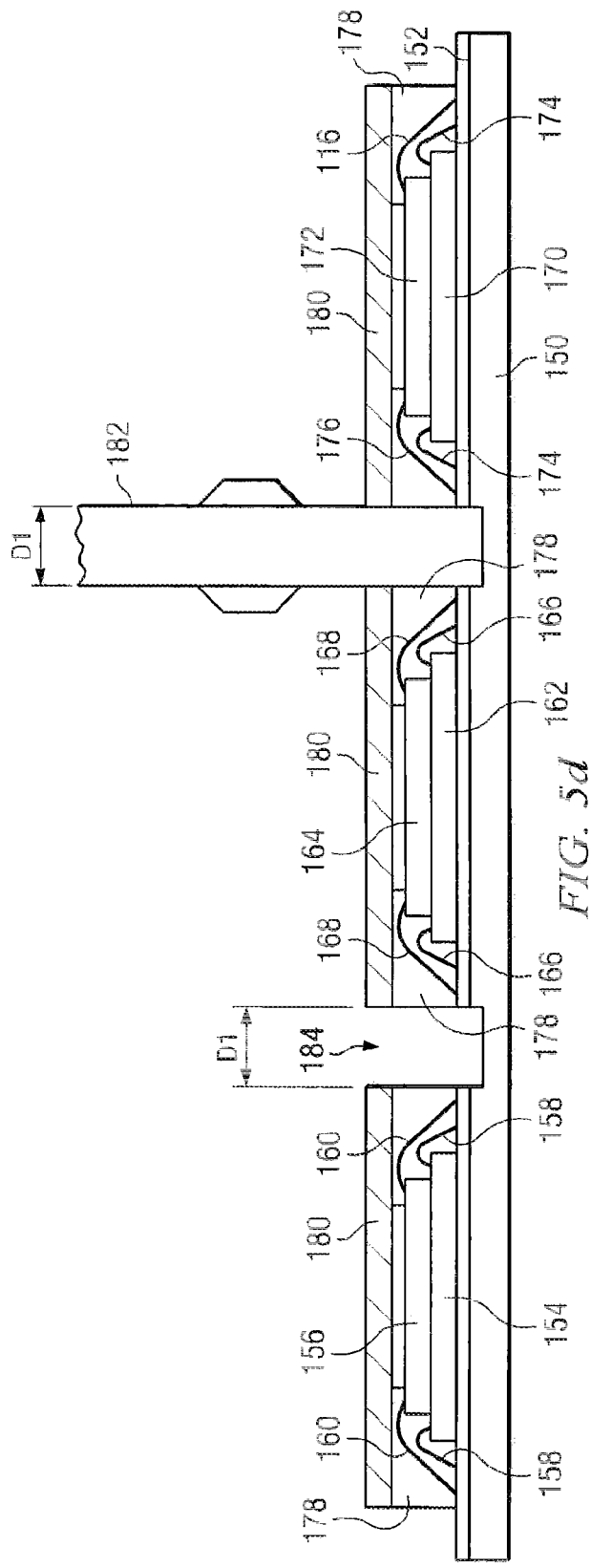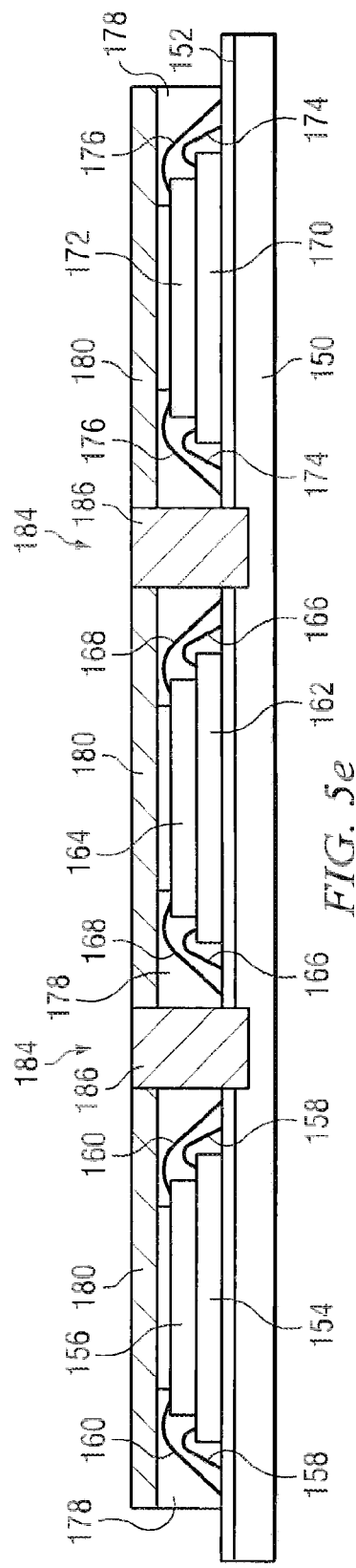

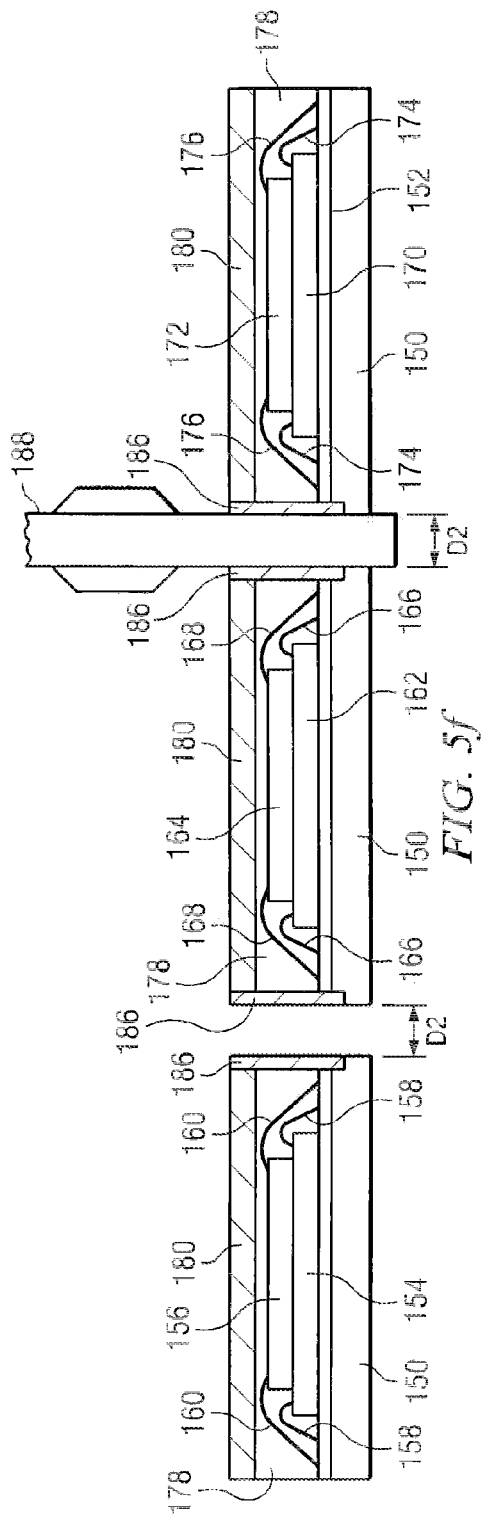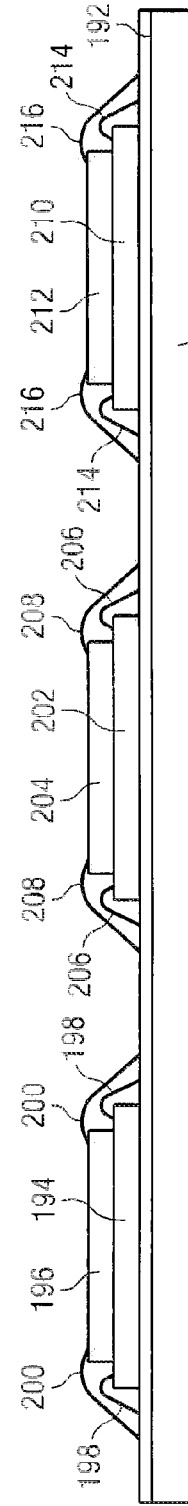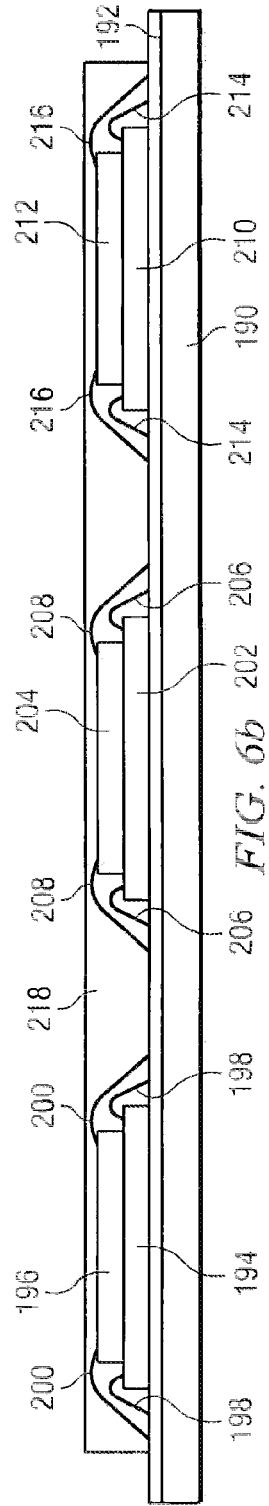

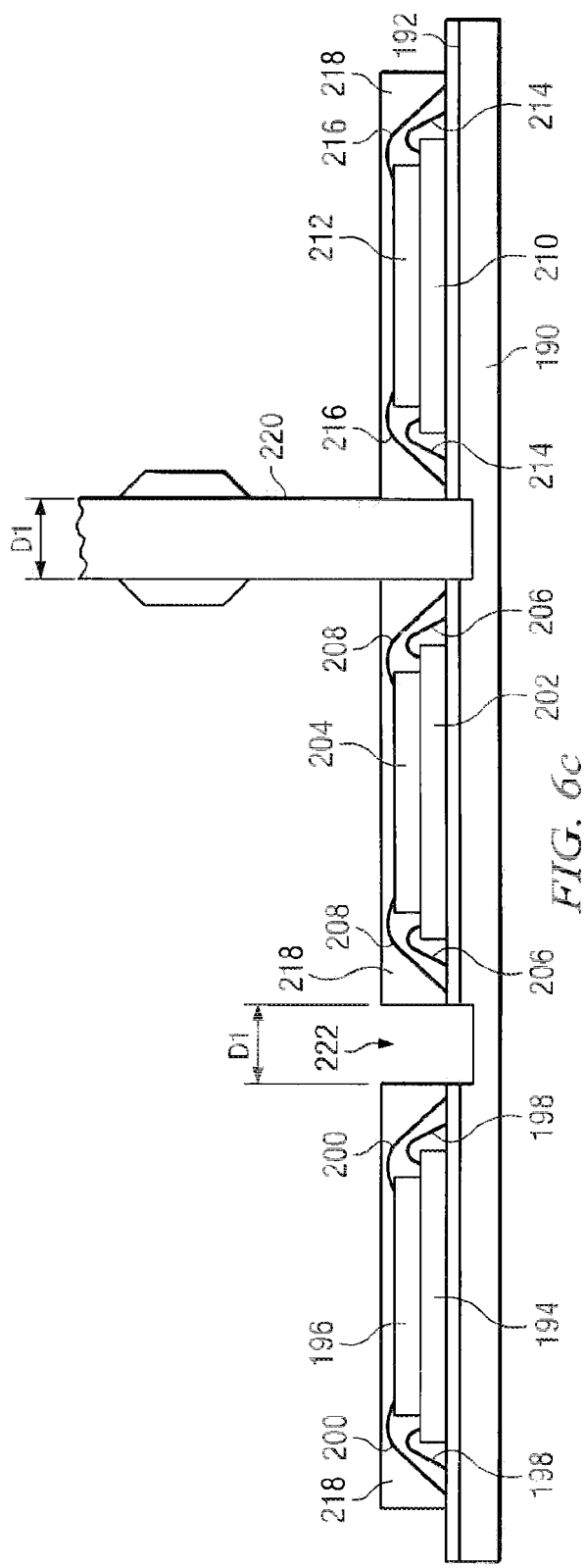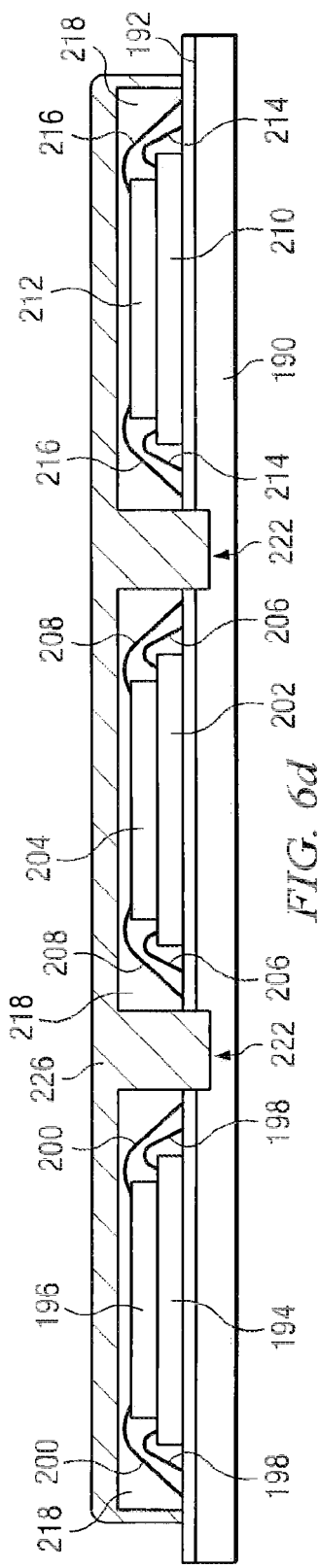

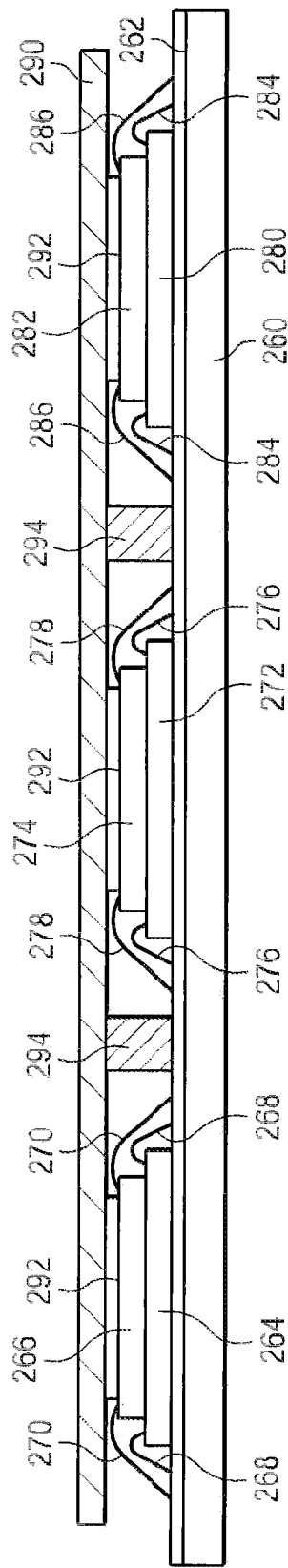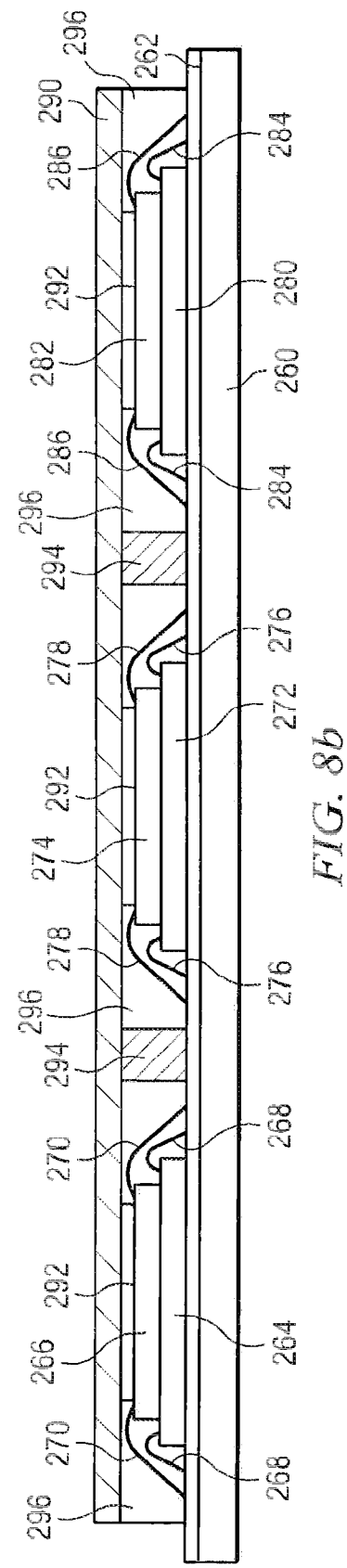

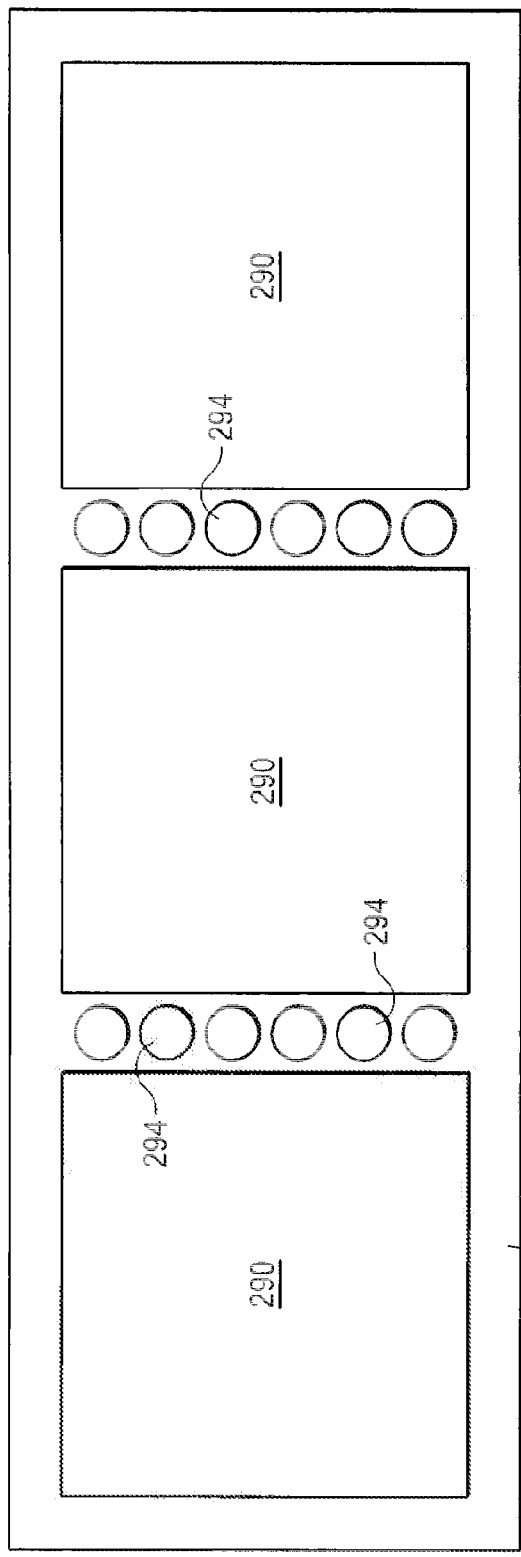
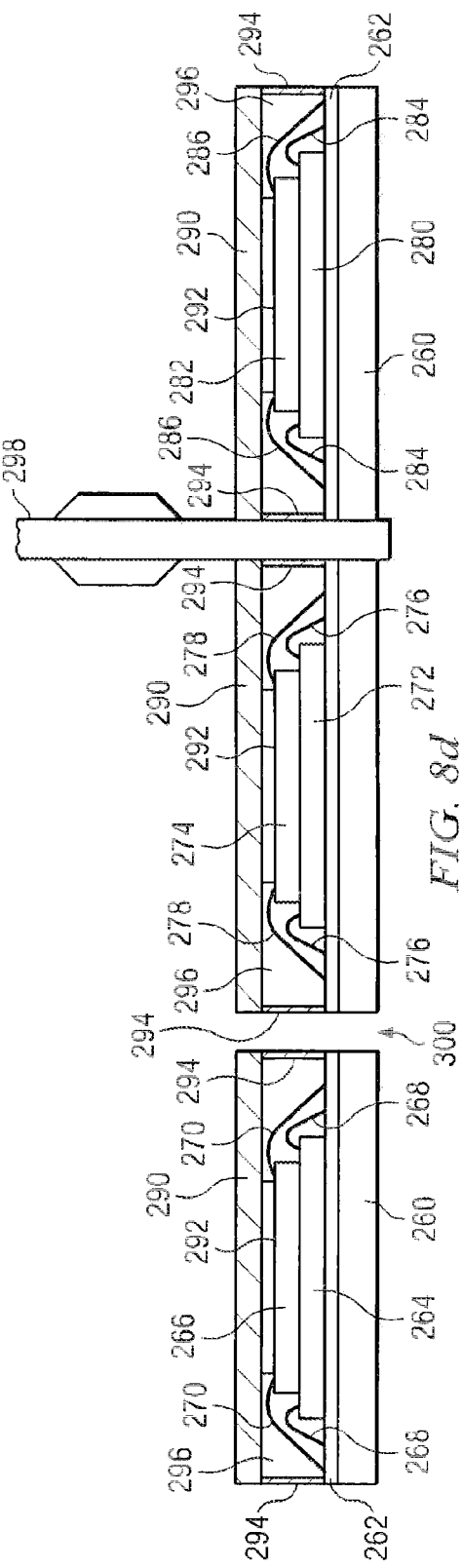
FIG. 8c
FIG. 8d

US 8,598,690 B2

SEMICONDUCTOR DEVICE HAVING CONDUCTIVE VIAS IN PERIPHERAL REGION CONNECTING SHIELDING LAYER TO GROUND

CLAIM TO DOMESTIC PRIORITY

The present application is a division of U.S. patent application Ser. No. 12/238,007, filed Sep. 25, 2008, now U.S. Pat. No. 8,110,441, and claims priority to the Ser. No. 12/238,007 application.

FIELD OF THE INVENTION

The present invention relates in general to semiconductor devices and, more particularly, to a semiconductor device using a conductive via formed in a periphery region around the device to electrically connect a shielding layer to a ground plane.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate undesired electromagnetic interference (EMI) and radio frequency interference (RFI), or other inter-device interference, such as capacitive, inductive, or conductive coupling, also known as cross-talk, which can interfere with the operation of adjacent circuit elements.

To isolate the semiconductor devices from EMI and RFI, a shielding layer is typically disposed over the device and connected to ground using a grounding wire or external connection. The shield is typically placed over the components and reflowed to form ground to PCB, which involves additional production steps and add costs to the manufacturing process.

SUMMARY OF THE INVENTION

A need exists to shield semiconductor devices from EMI, RFI, and other inter-device interference. Accordingly, in one embodiment, the present invention is a semiconductor device comprising a substrate having a ground plane disposed over a surface of or within the substrate. A plurality of semiconductor die is mounted over the surface of the substrate above the ground plane. An encapsulant is deposited over the substrate and the plurality of semiconductor die. A channel is formed in a peripheral region around the plurality of semiconductor die and through the encapsulant to a depth of the ground plane. The channel includes discrete sections having a length less than an entire length of the peripheral region. A shielding layer is formed over the plurality of semiconductor die and extends through the discrete sections to the ground plane.

In another embodiment, the present invention is a semiconductor device comprising a substrate, having a ground plane disposed over a surface of or within the substrate. A semiconductor die is mounted over the surface of the substrate above the ground plane. An encapsulant is deposited over the substrate and the semiconductor die. A channel is formed in a peripheral region around the semiconductor die that includes discrete sections having a length less than an entire length of the peripheral region. A shielding layer is formed over the semiconductor die and extends through the discrete sections to the ground plane.

In another embodiment, the present invention is a semiconductor device comprising a substrate having a ground plane disposed over a surface of or within the substrate. A semiconductor die is mounted over the surface of the substrate above the ground plane. A channel is formed in a peripheral region around the semiconductor die that includes discrete sections. A shielding layer is formed over the semiconductor die and is electrically connected to the ground plane through the discrete sections.

In another embodiment, the present invention is a semiconductor device comprising a substrate having a ground plane. A semiconductor die is mounted over the substrate. A plurality of conductive vias is formed in a peripheral region around the semiconductor die. A shielding layer is formed over the semiconductor die and electrically connected to the ground plane through the conductive vias.

BRIEF DESCRIPTION OF THE DRAWINGS

FIGS. 2a-2d illustrate further detail of the semiconductor packages mounted to the PCB;

FIGS. 3a-3i illustrate a process of forming a shielding layer with ground connection through a conductive via formed in peripheral region around the semiconductor die;

FIGS. 5a-5f illustrate an alternate process of forming a shielding layer with ground connection through a conductive via;

FIGS. 6a-6e illustrate another process of forming a shielding layer with electrical connection to a ground plane in the substrate;

FIGS. 8a-8d illustrate another process of forming a shielding layer with electrical connection to a ground plane in the substrate.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
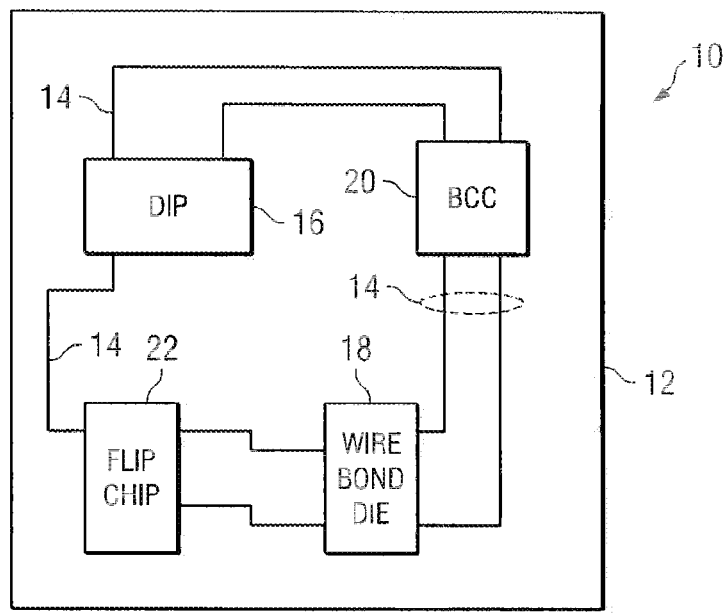
FIG. 1 illustrates a PCB with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip-chip package 22, are shown mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate premade components into electronic devices and systems. Because the semiconductor packages include sophisticated functionality and represent known good units (KGUs), electronic devices can be manufactured using cheaper components and shorten the manufacturing process. The resulting devices are less likely to fail and less expensive to manufacture resulting in lower costs for consumers.

Figure 2A:
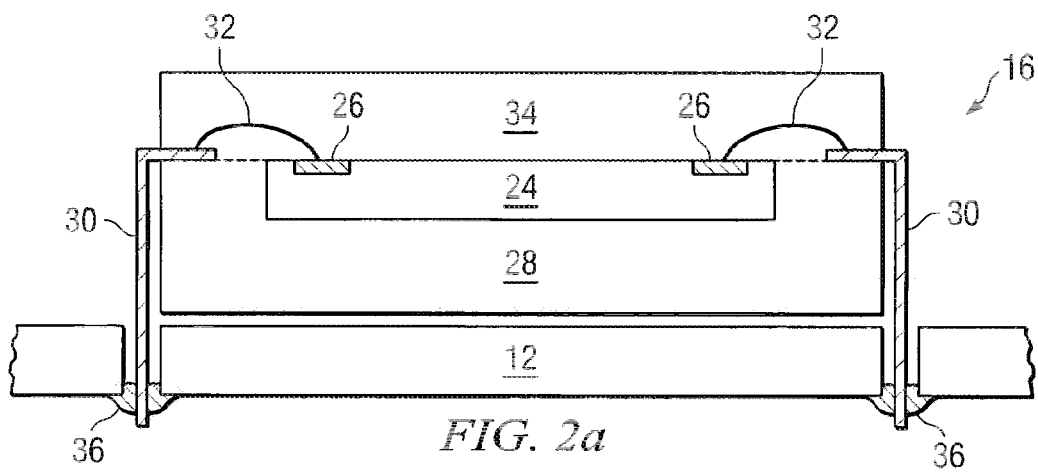

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die. For example, the circuit may include one or more transistors, diodes, inductors, capacitors, resistors, and other circuit elements formed within the active area of die 24. Contact pads 26 are made with a conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process. During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and bond wires 32 are formed between leads 30 and contact pads 26 of die 24. Encapsulant 34 is deposited over the package for environmental protection by preventing moisture and particles from entering the package and contaminating die 24, contact pads 26, or bond wires 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
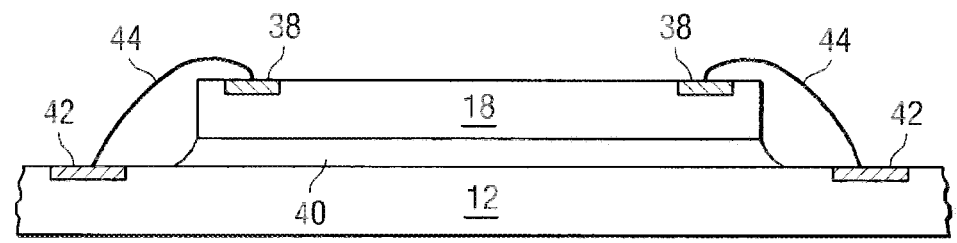

Referring to FIG. 2b, a wire bonded die 18 having contact pads 38 is mounted to PCB 12 using adhesive material 40. Contact pads 42 are formed on the surface of PCB 12 and electrically connect to one or more traces 14 formed on or within the layers of PCB 12. Bond wires 44 are formed between contact pads 38 of die 18 and contact pads 42 of PCB 12.

FIG. 2c illustrates further detail of BCC 20 with an incorporated semiconductor die, integrated circuit (IC), or combination thereof. Semiconductor die 46 having contact pads 48 is mounted over a carrier using an underfill or epoxy-resin adhesive material 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Bond wires 54 and bond pads 56 and 58 electrically connect contact pads 48 of die 46 to contact pads 52 of BCC 20. Mold compound or encapsulant 60 is deposited over die 46, bond wires 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is reflowed to form bumps 66 which form a mechanical and electrical connection between BCC 20 and PCB 12.

In FIG. 2d, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72 is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

Figure 3I:
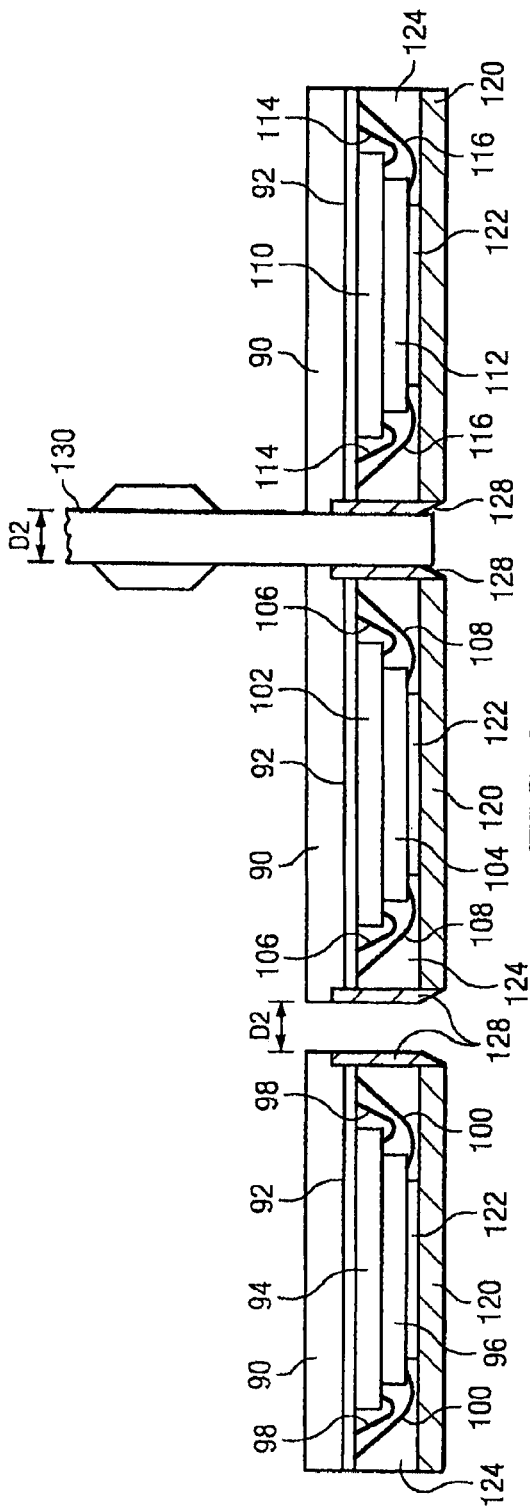

FIGS. 3a-3i illustrate a process of forming a shielding layer over a plurality of semiconductor die and electrically connecting the shielding layer to a ground plane. Each semiconductor die has an active area containing analog or digital circuits implemented as active devices, passive devices, conductive layers, and dielectric layers electrically interconnected according to the electrical design of the die. In FIG. 3a, a multi-layer laminate substrate 90 provides structural support and electrical interconnect for the semiconductor die. Substrate 90 can have multiple layers of silicon, silicon carbide, polymer, polymer composite, metal, ceramic, glass, glass epoxy, beryllium oxide, or other rigid material. In one embodiment, substrate 90 is about 0.26 to 0.56 millimeters (mm). A metal ground plane 92 is disposed over, under, or embedded within layers of substrate 90 and extends from under the semiconductor die into the dicing channel between the semiconductor die, as described below. For example, ground plane 92 is disposed about 0.02 mm below surface of substrate 90. Ground plane 92 can be Al, Cu, Sn, Ni, Au, or Ag. In other embodiments, ground plane 92 contains stainless steel, nickel silver, low-carbon steel, silicon-iron steel, and other metals. Ground plane 92 is electrically connected to an external low-impedance ground point to aid in the shielding feature, as described below.

A semiconductor die 94 is mounted to substrate 90 over ground plane 92 with an adhesive material. A semiconductor die 96 is mounted to semiconductor die 94 with an adhesive material. Semiconductor die 94 and 96 are electrically connected to an interconnect structure in substrate 90 with bond wires 98 and 100, respectively. In a similar manner, a semiconductor die 102 is mounted to substrate 90 over ground plane 92 with an adhesive material. A semiconductor die 104 is mounted to semiconductor die 102 with an adhesive material. Semiconductor die 102 and 104 are electrically connected to the interconnect structure in substrate 90 with bond wires 106 and 108, respectively. A semiconductor die 110 is mounted to substrate 90 over ground plane 92 with an adhesive material. A semiconductor die 112 is mounted to semiconductor die 110 with an adhesive material. Semiconductor die 110 and 112 are electrically connected to the interconnect structure in substrate 90 with bond wires 114 and 116, respectively. The adhesive material used to bond the semiconductor die can be thermal epoxy, polymer composite, or inorganic bonding compounds. The interconnect structure in FIG. 3a, i.e. between semiconductor die or IPDs, can also solder bumps in a flip chip arrangement.

Semiconductor die 94-96, 102-104, and 110-112 may contain baseband circuits that emit or are susceptible to electromagnetic interference (EMI), radio frequency interference (RFI), and other inter-device interference. In other embodiments, semiconductor die 94-96, 102-104, and 110-112 contain integrated passive devices (IPD) that generate or are susceptible to EMI or RFI. For example, the IPDs contained within semiconductor die 94-96, 102-104, and 110-112 provide the electrical characteristics needed for high frequency applications, such as high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device. In such systems, the output signal in the transmitter section of the radio frequency integrated circuit (RFIC) may interfere with the local oscillator (LO). The inductor can be used in the tank resonators of the LO in the RF transceiver. The LO includes a voltage-controlled oscillator (VCO) that is synchronized to an external crystal reference through a phase-locked loop (PLL). The VCO can be implemented as a cross-coupled amplifier circuit with a tuned resonant inductor-capacitor (LC) load. The inductor is made with one or two spiral inductor coils on the RFIC. External signals can couple into the VCO by magnetic induction directly into the tank resonator. If the external source is a periodic or quasi-periodic signal, it will introduce a spurious tone. In subsequent mixing, the RF signal is multiplied by the LO signal to transpose the band of interest down to low frequency for further signal processing. The presence of the spurious tone in the LO often causes out-of-band signals to be mixed into the base-band frequency range, which degrades the receiver sensitivity, adding both noise and cross-talk to the received signal. Therefore, each of these passive circuit elements has the potential to interfere with adjacent devices.

In FIG. 3b, a top or overlying shielding layer 120 is disposed over and attached to the semiconductor die using non-conductive adhesive material 122. Shielding layer 120 is made with conductive epoxy, laminate, or conductive plastics. Alternatively, shielding layer 120 can use copper, aluminum, stainless steel, nickel silver, low-carbon steel, silicon-iron steel, and other metals and composites capable of blocking EMI, RFI, and other inter-device interference.

In FIG. 3c, a molding compound or encapsulant 124 is deposited between substrate 90 and shielding layer 120. The encapsulant 124 encloses the semiconductor die. The encapsulant 124 can be made with epoxy acrylate or other polymer material and applied by transfer molding, liquid encapsulant molding, or other molding process. The encapsulant 124 is non-conductive and environmentally protects the semiconductor die from external elements and contaminants.

In FIG. 3d, a cutting blade 126 cuts a partial dicing channel or sawstreet 127 of width D1 between semiconductor die 94-96 and 102-104, and between semiconductor die 102-104 and 110-112. The cutting blade 126 removes a portion of shielding layer 120 and encapsulant 124, and cuts partially into substrate 90 to a depth sufficient to expose ground plane 92 but does not cut completely through substrate 90.

The sawstreet 127 is filled with electrically conductive material 128 to electrically contact ground plane 92 in FIG. 3e. The assembly is then cured. Conductive material 128 can be made with conductive epoxy. Alternatively, conductive material 128 can be metal solder, Cu, Au, Ag, Sn, Pb, Ni, Bi, or other electrically conductive solder, paste, or adhesive. Conductive material 128 can be dispensed by applicator, printed, screen printed, or other suitable method. In other embodiments, sawstreet 127 is only partially filled with conductive material 128 during application, as shown in FIG. 3f. The conductive material can be continuous along sawstreet 127, shown as conductive material 128a in the top view of FIG. 3g, or applied in discrete sections or segments as conductive material 128b.

In FIG. 3h, a cutting blade 130 singulates conductive material 128 and substrate 90 with width D2 to separate the semiconductor die. FIG. 3i shows cutting blade 130 singulating through the opposite side of substrate 90 for the case when conductive material 128 partially fills sawstreet 127. In either case, cutting blade 130 is narrower than cutting blade 126 (D2<D1) so that a sufficient portion of conductive material 128 remains along the sides of sawstreet 127 to form a conductive via in a peripheral region around the semiconductor die. The conductive via provides an electrical conduction path from shielding layer 120 to ground plane 92.

Figure 4:
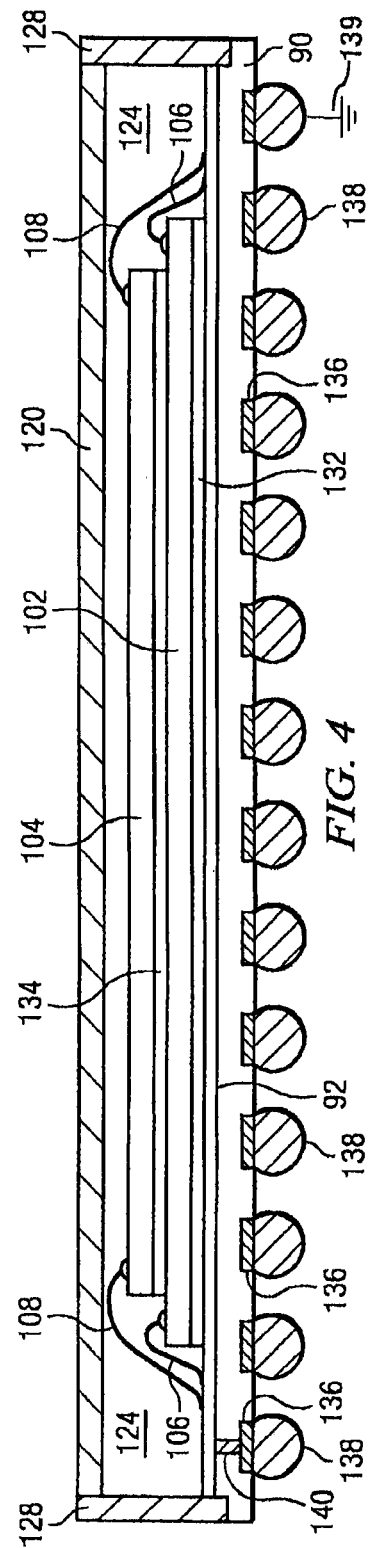
FIG. 4 illustrates the shielding layer covering a top of the die with ground connection through the conductive via.

FIG. 4 shows the final configuration of the semiconductor device with semiconductor die 102 mounted to substrate 90 with adhesive 132 and semiconductor die 104 mounted to semiconductor die 102 with adhesive material 134. Bond wires 106 and 108 electrically connect semiconductor die 102 and 104 to the interconnect structure in substrate 90, respectively. Conductive via 128 formed in the peripheral region around the semiconductor die electrically connects shielding layer 120 to ground plane 92. Shielding material 120 covers the semiconductor die to inhibit EMI and RFI from adversely influencing the electrical function of adjacent circuits.

In one embodiment, an electrically conductive solder material is deposited over contact pads 136 in substrate 90 using an evaporation, electrolytic plating, electroless plating, ball drop, or screen printing process. The solder material can be any metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 138. In some applications, solder bumps 138 are reflowed a second time to improve electrical connection to contact pads 136. Alternatively, contact pads 136 can be bare NiAu or Au finish, as found in a land grid array (LGA) module.

One or more solder bumps 138 electrically connect to ground plane 92 by way of conduction channel 140 in the interconnect structure of substrate 90. Accordingly, shielding layer 120 is electrically connected to one or more solder bumps 138 through conductive via 128, ground plane 92, and contact pads 136. Solder bumps 138 are electrically connected to an external low-impedance ground point 139 to aid in the shielding feature of layer 120. By connecting shielding layer 120 to ground using conductive via 128 formed in sawstreet 127, there is no need for additional manufacturing steps to form a dedicated ground connection.

A typical RF system requires multiple IPDs and other high frequency circuits in one or more semiconductor packages to perform the necessary electrical functions. However, high frequency electrical devices generate undesired EMI, RFI, or other inter-device interference, such as capacitive, inductive, or conductive coupling, also known as cross-talk, which can interfere with the operation of adjacent or nearby circuit elements. Shielding layer 120 completely covers all areas of encapsulant 124 relative to the top of the semiconductor die to provide isolation for the enclosed semiconductor devices with respect to EMI, RFI, or other inter-device interference. The interference can be generated internally or come from external semiconductor devices containing IPDs or RF circuits.

FIGS. 5a-5f illustrate an alternate process of forming a shielding layer over a plurality of semiconductor die and electrically connecting the shielding layer to a ground plane. Each semiconductor die has an active area containing analog or digital circuits implemented as active devices, passive devices, conductive layers, and dielectric layers electrically interconnected according to the electrical design of the die. In FIG. 5a, a multi-layer laminate substrate 150 provides structural support and electrical interconnect for the semiconductor die. Substrate 150 can have multiple layers of silicon, silicon carbide, polymer, polymer composite, metal, ceramic, glass, glass epoxy, beryllium oxide, or other rigid material. A metal ground plane 152 is disposed over, under or embedded within layers of substrate 150 and extends from under the semiconductor die into the dicing channel between the semiconductor die. Ground plane 152 can be Al, Cu, Sn, Ni, Au, or Ag. In other embodiments, ground plane 152 contains stainless steel, nickel silver, low-carbon steel, silicon-iron steel, and other metals. Ground plane 152 is electrically connected to an external low-impedance ground point.

A semiconductor die 154 is mounted to substrate 150 over ground plane 152 with an adhesive material. A semiconductor die 156 is mounted to semiconductor die 154 with an adhesive material. Semiconductor die 154 and 156 are electrically connected to an interconnect structure in substrate 150 with bond wires 158 and 160, respectively. In a similar manner, a semiconductor die 162 is mounted to substrate 150 over ground plane 152 with an adhesive material. A semiconductor die 164 is mounted to semiconductor die 162 with an adhesive material. Semiconductor die 162 and 164 are electrically connected to the interconnect structure in substrate 150 with bond wires 166 and 168, respectively. A semiconductor die 170 is mounted to substrate 150 over ground plane 152 with an adhesive material. A semiconductor die 172 is mounted to semiconductor die 170 with an adhesive material. Semiconductor die 170 and 172 are electrically connected to the interconnect structure in substrate 150 with bond wires 174 and 176, respectively. The adhesive material used to bond the semiconductor die can be thermal epoxy, polymer composite, or inorganic bonding compounds. The interconnect structure in FIG. 5a, i.e. between semiconductor die or IPDs, can also solder bumps in a flip chip arrangement.

Semiconductor die 154-156, 162-164, and 170-172 may contain baseband circuits that are susceptible to EMI, RFI, and other inter-device interference. In other embodiments, semiconductor die 154-156, 162-164, and 170-172 contain IPD that generate EMI or RFI. In any case, it is desirable to shield the EMI and RFI from adversely influencing the operation of adjacent circuits.

In FIG. 5b, a molding compound or encapsulant 178 is deposited over substrate 150 and semiconductor die 154-156, 162-164, and 170-172. The encapsulant 178 encloses the semiconductor die. The encapsulant 178 can be made with epoxy acrylate or other polymer material and applied by transfer molding, liquid encapsulant molding, or other molding process. The encapsulant 178 is non-conductive and environmentally protects the semiconductor device from external elements and contaminants.

In FIG. 5c, an electrically conductive shielding layer 180 with an optional seed layer is conformally deposited over encapsulant 178. Shielding layer 180 is made with conductive epoxy, laminate, or conductive plastics. Alternatively, shielding layer 180 can use copper, aluminum, stainless steel, nickel silver, low-carbon steel, silicon-iron steel, laminate, conductive plastics, and other metals and composites capable of blocking EMI, RFI, and other inter-device interference. The seed layer can be made with Cu, Ni, nickel vanadium (NiV), Au, or Al. The seed layer and shielding layer 180 are patterned and conformally deposited using an electrolytic plating, electroless plating, sputtering, PVD, CVD, or other suitable metal deposition process. For non-metal materials, shielding layer 180 can be applied by spraying or painting.

In FIG. 5d, a cutting blade 182 cuts a partial dicing channel or sawstreet 184 of width D1 between semiconductor die 154-156 and 162-164, and between semiconductor die 162-164 and 170-172. The cutting blade 182 removes a portion of shielding layer 180 and encapsulant 178, and cuts partially into substrate 150 to a depth sufficient to expose ground plane 152 but does not cut completely through substrate 150.

The sawstreet 184 is filled with electrically conductive material 186 to electrically connect shielding layer 180 with ground plane 152 in FIG. 5e. The assembly is then cured. Conductive material 186 can be made with conductive epoxy. Alternatively, conductive material 186 can be Cu, Au, Ag, Sn, Pb, Ni, Bi, or other electrically conductive paste or adhesive. Conductive material 186 can be dispensed by applicator, printed, screen printed, or other suitable method. In other embodiments, sawstreet 184 is only partially filled with conductive material 186 during application, such as shown in FIG. 3f. The conductive material can be continuous along sawstreet 184, or applied in discrete sections, as shown in FIG. 3g.

In FIG. 5f, a cutting blade 188 singulates conductive material 180 and substrate 150 with width D2 to separate the semiconductor die. Cutting blade 188 is narrower than cutting blade 182 (D2<D1) so that a sufficient portion of conductive material 180 remains along the sides of sawstreet 184 to form a conductive via in a peripheral region around the semiconductor die. The conductive via provides an electrical conduction path from shielding layer 180 to ground plane 152.

Figure 6E:
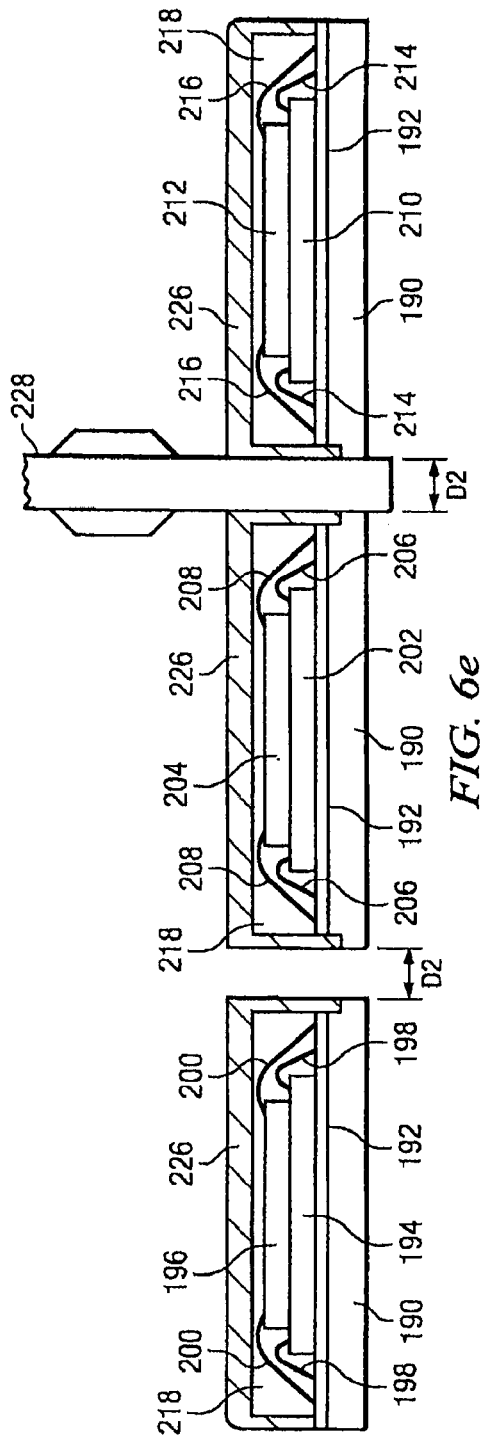

FIGS. 6a-6e illustrate another process of forming a shielding layer over a plurality of semiconductor die and electrically connecting the shielding layer to a ground plane. Each semiconductor die has an active area containing analog or digital circuits implemented as active devices, passive devices, conductive layers, and dielectric layers electrically interconnected according to the electrical design of the die. In FIG. 6a, a multi-layer laminate substrate 190 provides structural support and electrical interconnect for the semiconductor die. Substrate 190 can have multiple layers of silicon, silicon carbide, polymer, polymer composite, metal, ceramic, glass, glass epoxy, beryllium oxide, or other rigid material. A metal ground plane 192 is disposed over, under or embedded within layers of substrate 190 and extends from under the semiconductor die into the dicing channel between the semiconductor die. Ground plane 192 can be Al, Cu, Sn, Ni, Au, or Ag. In other embodiments, ground plane 192 contains stainless steel, nickel silver, low-carbon steel, silicon-iron steel, and other metals. Ground plane 192 is electrically connected to an external low-impedance ground point.

A semiconductor die 194 is mounted to substrate 190 over ground plane 192 with an adhesive material. A semiconductor die 196 is mounted to semiconductor die 194 with an adhesive material. Semiconductor die 194 and 196 are electrically connected to an interconnect structure in substrate 190 with bond wires 198 and 200, respectively. In a similar manner, a semiconductor die 202 is mounted to substrate 190 over ground plane 192 with an adhesive material. A semiconductor die 204 is mounted to semiconductor die 202 with an adhesive material. Semiconductor die 202 and 204 are electrically connected to the interconnect structure in substrate 190 with bond wires 206 and 208, respectively. A semiconductor die 210 is mounted to substrate 190 over ground plane 192 with an adhesive material. A semiconductor die 212 is mounted to semiconductor die 210 with an adhesive material. Semiconductor die 210 and 212 are electrically connected to the interconnect structure in substrate 190 with bond wires 214 and 216, respectively. The adhesive material used to bond the semiconductor die can be thermal epoxy, polymer composite, or inorganic bonding compounds.

Semiconductor die 194-196, 202-204, and 210-212 may contain baseband circuits that are susceptible to EMI, RFI, and other inter-device interference. In other embodiments, semiconductor die 194-196, 202-204, and 210-212 contain IPD that generate EMI or RFI. In any case, it is desirable to shield the EMI and RFI from adversely influencing the operation of adjacent circuits.

In FIG. 6b, a molding compound or encapsulant 218 is deposited over substrate 190 and semiconductor die 194-196, 202-204, and 210-212. The encapsulant 218 encloses the semiconductor die. The encapsulant 218 can be made with epoxy acrylate or other polymer material and applied by transfer molding, liquid encapsulant molding, or other molding process. The encapsulant 218 is non-conductive and environmentally protects the semiconductor device from external elements and contaminants.

In FIG. 6c, a cutting blade 220 removes encapsulant 218 between semiconductor die 194-196 and 202-204, and between semiconductor die 202-204 and 210-212, in a partial dicing step. The cutting blade 220 cuts a dicing channel or sawstreet 222 of width D1, partially into substrate 190 to a depth sufficient to expose ground plane 192 but does not cut completely through substrate 190.

In FIG. 6d, an electrically conductive shielding layer or paste 226 is conformally deposited or coated over encapsulant 218 and fills sawstreet 222. Shielding layer 226 is made with conductive epoxy, laminate, or conductive plastics. Alternatively, shielding layer 226 can use copper, aluminum, stainless steel, nickel silver, low-carbon steel, silicon-iron steel, laminate, conductive plastics, and other metals and composites capable of blocking EMI, RFI, and other inter-device interference. Shielding layer 226 can be dispensed by applicator, printed, screen printed, or other suitable method.

In FIG. 6e, a cutting blade 228 singulates shielding layer 226 and substrate 190 to separate the semiconductor die. Cutting blade 228 is narrower than cutting blade 220 so that a sufficient portion of shielding layer 226 remains along the sides of sawstreet 222 to maintain an electrical conduction path to ground plane 192.

Figure 7:
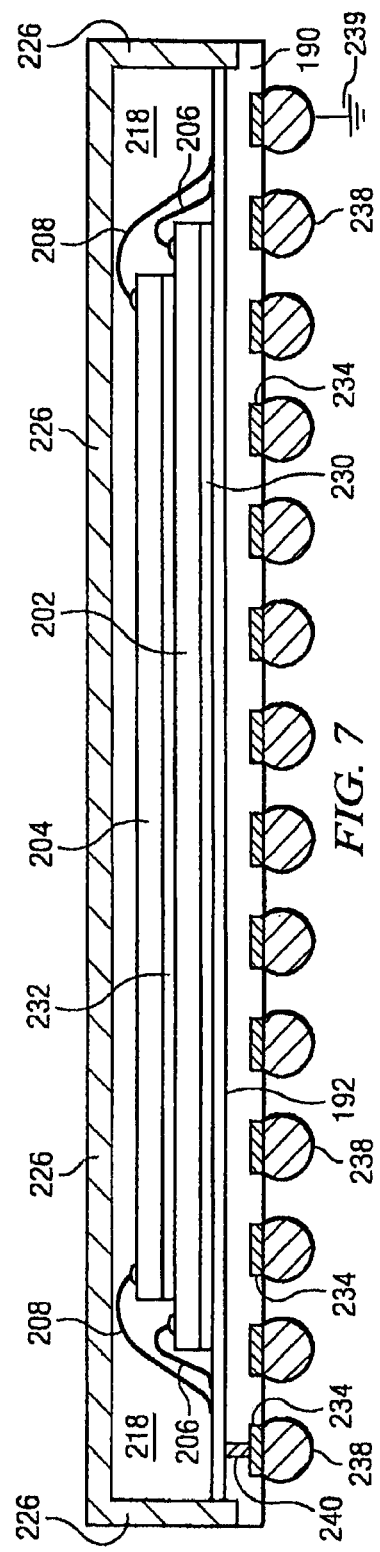
FIG. 7 illustrates the shielding layer covering the top and sides of the die with electrical connection to a ground plane in the substrate.

FIG. 7 shows the final configuration of the semiconductor device in a ball grid array (BGA) package. Semiconductor die 202 is mounted to substrate 190 with adhesive 230 and semiconductor die 204 mounted to semiconductor die 202 with adhesive material 232. Bond wires 206 and 208 electrically connect semiconductor die 202 and 204 to the interconnect structure in substrate 190, respectively. Shielding layer 226 electrically connects to ground plane 192. Shielding material 226 covers the top and sides of the semiconductor die to inhibit EMI and RFI from adversely influencing the electrical function of adjacent circuits.

An electrically conductive solder material is deposited over contact pads 234 in substrate 190 using an evaporation, electrolytic plating, electroless plating, ball drop, or screen printing process. The solder material can be any metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 238. In some applications, solder bumps 238 are reflowed a second time to improve electrical connection to contact pads 234. The interconnect structure can be solder bumps or LGA.

One or more solder bumps 238 electrically connect to ground plane 192 by way of conduction channel 240 in the interconnect structure of substrate 190. Accordingly, shielding layer 226 is electrically connected to one or more solder bumps 238 through ground plane 192 and contact pads 234. Solder bumps 238 are electrically connected to an external ground point 239 to aid in the shielding feature of layer 226. By connecting shielding layer 226 to ground plane 192, there is no need for additional manufacturing steps to form a dedicated ground connection.

FIGS. 8a-8d illustrate another process of forming a shielding layer over a plurality of semiconductor die and electrically connecting the shielding layer to a ground plane. Each semiconductor die has an active area containing analog or digital circuits implemented as active devices, passive devices, conductive layers, and dielectric layers electrically interconnected according to the electrical design of the die. In FIG. 8a, a multi-layer laminate substrate 260 provides structural support and electrical interconnect for the semiconductor die. Substrate 260 can have multiple layers of silicon, silicon carbide, polymer, polymer composite, metal, ceramic, glass, glass epoxy, beryllium oxide, or other rigid material. A metal ground plane 262 is disposed over, under, or embedded within layers of substrate 260 and extends from under the semiconductor die into the dicing channel between the semiconductor die, as described below. Ground plane 262 can be Al, Cu, Sn, Ni, Au, or Ag. In other embodiments, ground plane 262 contains stainless steel, nickel silver, low-carbon steel, silicon-iron steel, and other metals. Ground plane 262 is electrically connected to an external low-impedance ground point to aid in the shielding feature.

A semiconductor die 264 is mounted to substrate 260 over ground plane 262 with an adhesive material. A semiconductor die 266 is mounted to semiconductor die 264 with an adhesive material. Semiconductor die 264 and 266 are electrically connected to an interconnect structure in substrate 260 with bond wires 268 and 270, respectively. In a similar manner, a semiconductor die 272 is mounted to substrate 260 over ground plane 262 with an adhesive material. A semiconductor die 274 is mounted to semiconductor die 272 with an adhesive material. Semiconductor die 272 and 274 are electrically connected to the interconnect structure in substrate 260 with bond wires 276 and 278, respectively. A semiconductor die 280 is mounted to substrate 260 over ground plane 262 with an adhesive material. A semiconductor die 282 is mounted to semiconductor die 280 with an adhesive material. Semiconductor die 280 and 282 are electrically connected to the interconnect structure in substrate 260 with bond wires 284 and 286, respectively. The adhesive material used to bond the semiconductor die can be thermal epoxy, polymer composite, or inorganic bonding compounds.

Semiconductor die 264-266, 272-274, and 280-282 may contain baseband circuits that emit or are susceptible to EMI, RFI, and other inter-device interference. In other embodiments, semiconductor die 264-266, 272-274, and 280-282 contain IPD that generate or are susceptible to EMI or RFI.

A top or overlying shielding layer 290 is disposed over and attached to the semiconductor die using non-conductive adhesive material 292. Shielding layer 290 is made with conductive epoxy, laminate, or conductive plastics. Alternatively, shielding layer 290 can use copper, aluminum, stainless steel, nickel silver, low-carbon steel, silicon-iron steel, and other metals and composites capable of blocking EMI, RFI, and other inter-device interference. A conductive solder or adhesive 294 is deposited between shielding layer 290 and ground plane 262.

In FIG. 8b, a molding compound or encapsulant 296 is deposited between substrate 260 and shielding layer 290. The encapsulant 296 encloses the semiconductor die. The encapsulant 296 can be made with epoxy acrylate or other polymer material and applied by transfer molding, liquid encapsulant molding, or other molding process. The encapsulant 296 is non-conductive and environmentally protects the semiconductor die from external elements and contaminants.

The top view of FIG. 8c shows discrete circular conductive solder or adhesive 294 deposited between shielding layer 290 and ground plane 262.

In FIG. 8d, a cutting blade 298 cuts a channel or sawstreet 300 between semiconductor die 264-266 and 272-274, and between semiconductor die 272-274 and 280-282. The width of cutting blade 298 is less than the diameter of conductive material 294. The cutting blade 298 singulates through conductive material 294 and substrate 260 to separate the semiconductor die. A portion of conductive material 294 remains along the sides of sawstreet 300 to form a conductive via in a peripheral region around the semiconductor die. The conductive via provides an electrical conduction path from shielding layer 290 to ground plane 262.

In summary, the semiconductor devices are enclosed by shielding material using a simple manufacturing process. A ground plane is embedded between layers of the substrate.

Semiconductor die are mounted to the substrate over the ground plane. A top shielding layer is disposed over the semiconductor die. The shielding layer isolates each circuit element from cross-talk generated by the adjacent circuit element. The cross-talk may be in the form of conductive coupling, inductive coupling, magnetic field coupling, electric field coupling, or capacitive coupling depending on the electrical nature of the adjacent device. The shielding layer is electrically connected to ground through a conductive via disposed in a peripheral region around the semiconductor die. The semiconductor device can also be mounted in a land grid array (LGA) package.

While one or more embodiments of the present invention have been illustrated in detail, the skilled artisan will appreciate that modifications and adaptations to those embodiments may be made without departing from the scope of the present invention as set forth in the following claims.

What is claimed is:

1. A semiconductor device, comprising:
    a substrate including a ground plane disposed over a first surface of or within the substrate;
    a semiconductor die disposed over the first surface of the substrate above the ground plane;
    an encapsulant deposited over the first surface of the substrate and the semiconductor die;
    a first shielding layer formed over the semiconductor die and encapsulant;
    a first channel formed in a peripheral region around the semiconductor die and through the first shielding layer and encapsulant and only partially through the substrate to contact the ground plane, the first channel including discrete sections having a length less than an entire length of the peripheral region; and
    a second shielding layer formed into the first channel and extending from the first shielding layer to the ground plane.

2. The semiconductor device of claim 1, further including an interconnect structure formed on the substrate and electrically connected to the ground plane.

3. The semiconductor device of claim 2, further including bond wires electrically connecting the semiconductor die to the interconnect structure.

4. The semiconductor device of claim 2, wherein the first shielding layer and the second shielding layer are electrically connected to a ground point through the ground plane and interconnect structure.

5. The semiconductor device of claim 1, wherein a surface of the semiconductor die contacts the first shielding layer.

6. A semiconductor device, comprising:
    a substrate including a ground plane disposed over a first surface of or within the substrate;
    a semiconductor die disposed over the first surface of the substrate above the ground plane;
    an encapsulant deposited over the first surface of the substrate and the semiconductor die;
    a first shielding layer formed over the semiconductor die and encapsulant;
    a first channel formed in a peripheral region around the semiconductor die through the first shielding layer and encapsulant and partially through the substrate to the ground plane; and
    a second shielding layer formed into the first channel and extending from the first shielding layer to the ground plane.

7. The semiconductor device of claim 6, further including an interconnect structure formed on the substrate and electrically connected to the ground plane.

8. The semiconductor device of claim 7, wherein the interconnect structure includes bumps or land grid array.

9. The semiconductor device of claim 7, further including bond wires electrically connecting the semiconductor die to the interconnect structure.

10. The semiconductor device of claim 6, further including bumps formed over a backside of the substrate opposite the semiconductor die.

11. The semiconductor device of claim 6, wherein a surface of the semiconductor die contacts the first shielding layer.

12. The semiconductor device of claim 6, wherein the first shielding layer includes conductive epoxy, laminate, and conductive plastics.

13. A semiconductor device, comprising:
    a substrate including a ground plane disposed over a first surface of or within the substrate;
    a semiconductor die disposed over the first surface of the substrate above the ground plane;
    a first shielding layer formed over the semiconductor die;
    a channel formed in a peripheral region around the semiconductor die through the first shielding layer and partially through the substrate to the ground plane; and
    a second shielding layer formed in the channel from the first shielding layer to the ground plane.

14. The semiconductor device of claim 13, further including bond wires electrically connecting the semiconductor die to the substrate.

15. The semiconductor device of claim 13, wherein the first shielding layer and the second shielding layer are electrically connected to a ground point through the ground plane.

16. The semiconductor device of claim 13, wherein a surface of the semiconductor die contacts the first shielding layer.

17. The semiconductor device of claim 13, further including bumps or a land grid array formed over the substrate and electrically connected to the ground plane.

18. The semiconductor device of claim 13, further including bumps formed over a backside of the substrate opposite the semiconductor die.

19. The semiconductor device of claim 13, wherein the first shielding layer includes conductive epoxy, laminate, and conductive plastics.

* * * * *